United States Patent
Iwabuchi et al.

(10) Patent No.: US 8,039,322 B2
(45) Date of Patent: Oct. 18, 2011

(54) SEMICONDUCTOR DEVICE AND MANUFACTURING METHOD THEREOF

(75) Inventors: Akio Iwabuchi, Niiza (JP); Shuichi Kaneko, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 33 days.

(21) Appl. No.: 12/482,060

(22) Filed: Jun. 10, 2009

(65) Prior Publication Data
US 2009/0315071 A1 Dec. 24, 2009

(30) Foreign Application Priority Data
Jun. 23, 2008 (JP) ................... 2008-163250

(51) Int. Cl.
*H01L 21/332* (2006.01)
(52) U.S. Cl. ............... 438/133; 438/135; 257/E29.183
(58) Field of Classification Search .................. 438/133, 438/135, 137–139
See application file for complete search history.

(56) References Cited

U.S. PATENT DOCUMENTS
5,372,954 A * 12/1994 Terashima .................. 438/138
2009/0079085 A1 * 3/2009 Hannuki et al. ............. 257/773

FOREIGN PATENT DOCUMENTS
JP 2006-303410 11/2006
* cited by examiner

*Primary Examiner* — Chuong A Luu
*Assistant Examiner* — Nga Doan
(74) *Attorney, Agent, or Firm* — Oblon, Spivak, McClelland, Maier & Neustadt, L.L.P.

(57) ABSTRACT

A manufacturing method of a semiconductor device 10 includes forming a plurality of second conductive second semiconductor regions at specific intervals on one main surface of a first conductive first semiconductor region, the plurality of second conductive second semiconductor regions being opposite to the first conductive first semiconductor region, forming a plurality of the first conductive third semiconductor regions on a main surface of the second semiconductor region, the plurality of the first conductive third regions being separated from each other, forming a plurality of holes at specific intervals on an another main surface which faces the one main surface of the first semiconductor region, the plurality of holes being separated from each other, forming a pair of adjacent second conductive fourth semiconductor regions which are alternately connected at a bottom part of the hole within the first semiconductor region, and burying an electrode within the hole.

6 Claims, 7 Drawing Sheets

SEMICONDUCTOR DEVICE AND MANUFACTURING METHOD THEREOF

CROSS REFERENCE TO RELATED APPLICATION

This application is based upon and claims the benefit of priority from the prior Japanese Patent Application No. 2008-163.250 filed on Jun. 23, 2008, the entire contents of which is incorporated herein by reference.

BACKGROUND OF THE INVENTION

1. Field of the Invention

This invention relates to a semiconductor device and a method of manufacturing the same, and more particularly relates to a semiconductor device which operates as a switching device which can control a large current at high speeds, and a method of manufacturing such a semiconductor device.

2. Description of the Related Art

An IGBT (Insulated Gate Bipolar Transistor) is a semiconductor device which can control a large current at high speeds. In the manufacturing process of this IGBT, a semiconductor wafer in which two epitaxial layers of $n^+$ type semiconductor layer (buffer layer) and an $n^-$ type semiconductor layer is made to grow on generally p type semiconductor substrate is used. And the IGBT is manufactured by forming a base region, a source region and a gate electrode respectively on this semiconductor wafer. The semiconductor wafer used in this type of IGBT is expensive due to the long time required for growth of the epitaxial layers and the cost of this semiconductor wafer significantly increases the manufacturing costs of the IGBT.

As a method for avoiding these high costs, a semiconductor wafer is adopted in which the semiconductor wafer is thinned, impurities are implanted using ion implantation from the rear surface of the semiconductor wafer and a $p^+$ type semiconductor region and an $n^+$ type semiconductor region (buffer region) are formed. A back-grind process is used for thinning the semiconductor wafer. In an IGBT which is manufactured by using a semiconductor wafer thinned in this way, manufacturing costs can be reduced and heat discharge effects from the rear surface of the substrate can be expected.

Furthermore, this type of semiconductor device is referred to in Japanese Patent Laid-Open Publication No. 2006-303410, for example.

However, in the semiconductor device stated above, the following points were not considered. For example, because a semiconductor wafer is thinned by performing a back-grind process until the thickness of an $n^-$ type semiconductor layer (epitaxial layer) is reached, manufacturing processes after thinning of the semiconductor wafer become more difficult leading to further increases in manufacturing costs.

In addition, while a reduction in ON resistance and heat discharge effects of the semiconductor device can be expected by adopting a thinned semiconductor wafer, it is more difficult to avoid a reduction in mechanical strength due to thinning of the semiconductor wafer.

SUMMARY OF THE INVENTION

The present invention attempts to resolve the above stated problems. Therefore, the present invention proposes a semiconductor device and a manufacturing method thereof in which heat discharge effects are improved, mechanical strength of a substrate is improved, the manufacturing process is simple and manufacturing costs can be reduced.

According to a first feature of the embodiment of the invention, a method of manufacturing a semiconductor device includes forming a plurality of second conductive second semiconductor regions at specific intervals on one main surface of a first conductive first semiconductor region, the plurality of second conductive second semiconductor regions being opposite to the first conductive of the first semiconductor region, forming a plurality of the first conductive third semiconductor regions on a main surface of the second semiconductor region, the plurality of the first conductive third regions being separated from each other, forming a control electrode on the one main surface side, forming a plurality of holes at specific intervals on an another main surface which faces the one main surface of the first semiconductor region, the plurality of holes being separated from each other, forming a pair of adjacent second conductive fourth semiconductor regions which are alternately connected at a bottom part of the hole within the first semiconductor region, and burying an electrode within the hole.

The method of manufacturing the semiconductor device related to the first feature may also include the fourth semiconductor region being formed at the bottom part and along a side wall of the hole within the first semiconductor region.

The method of manufacturing the semiconductor device related to the first feature may also include the second conductive impurities being introduced to the bottom part of the holes within the first semiconductor region and a pair of the fourth semiconductor regions which are alternately connected being formed by diffusing the impurities in a width direction of the hole.

The method of manufacturing the semiconductor device related to the first feature may also include a conductive material having a higher mechanical strength compared to a mechanical strength of the first semiconductor region being buried within the holes.

According to a second feature of the embodiment of the invention, a semiconductor device may include a first conductive first semiconductor region, a plurality of second conductive second semiconductor regions formed at specific intervals on one main surface of a first conductive first semiconductor region, the plurality of second conductive second semiconductor regions being opposite to the first conductive of the first semiconductor region, a plurality of the first conductive third semiconductor regions formed on the one main surface of the second semiconductor region, the plurality of the first conductive third regions being separated from each other, a gate electrode formed via a gate insulation film and arranged across one of the third semiconductor regions of one of the second semiconductor regions and one of the third semiconductor regions of another adjacent one of the second semiconductor regions, a source electrode electrically connected to a main surface of the second semiconductor region and the third semiconductor region, a plurality of holes formed at specific intervals on an another main surface which faces the one main surface of the first semiconductor region, the plurality of holes being separated from each other, a pair of adjacent the second conductive fourth semiconductor regions alternately connected and arranged at a bottom part of the holes within the first semiconductor region, and a drain electrode buried within the holes.

The semiconductor device related to the second feature may also include the fourth semiconductor region being formed thickly at the bottom part of the holes and being formed thinly between the holes.

The semiconductor device related to the second feature may also include the drain electrode being formed from a conductive material having a higher mechanical strength compared to a mechanical strength of the first semiconductor.

DETAILED DESCRIPTION OF THE INVENTION

Figure 1:
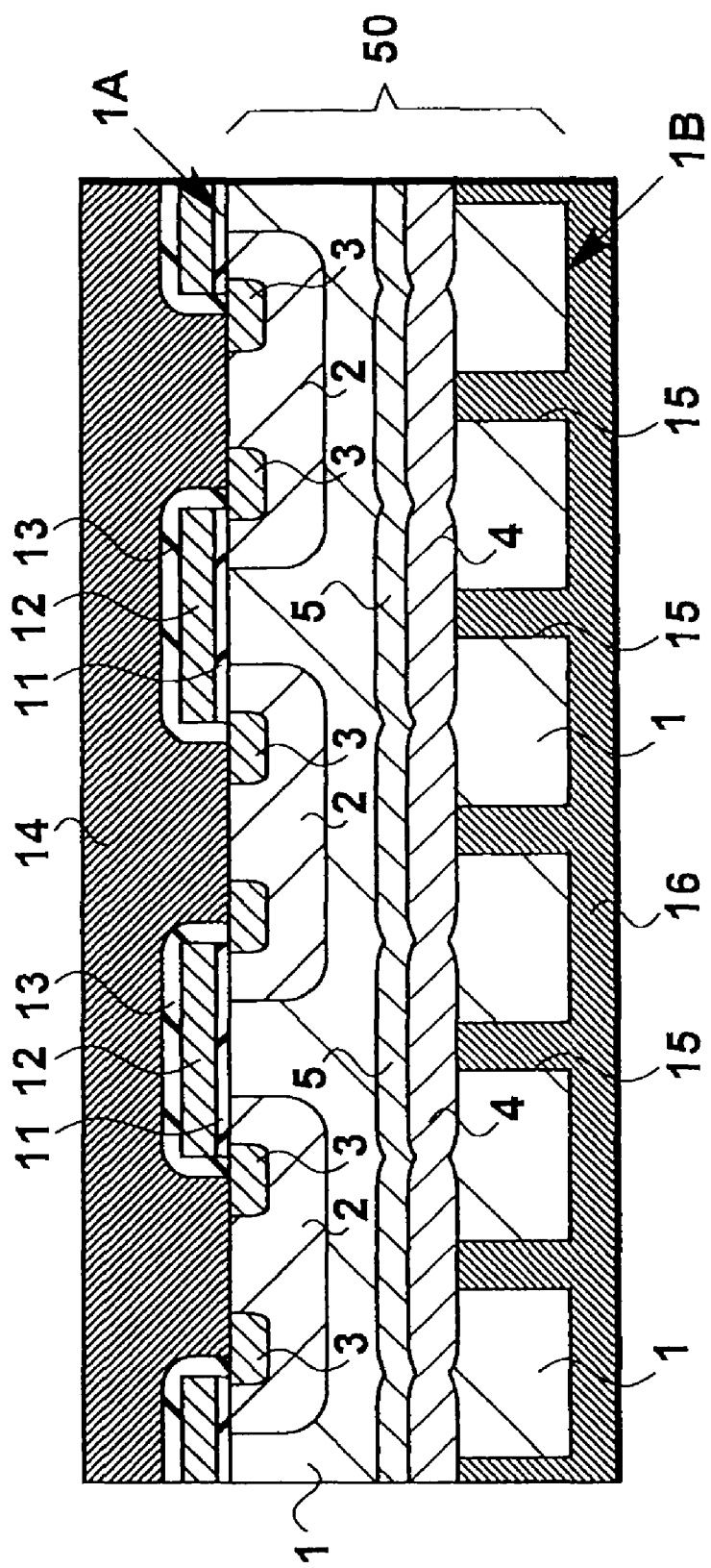
FIG. 1 is cross sectional diagram of a semiconductor device related to a first embodiment of the present invention.

The invention will be described with reference to the attached drawings. Like or corresponding parts are denoted by like or corresponding reference numerals. The drawings are schematic, and may sometimes differ from actual components. Further, dimensions and ratios of components may be different between drawings. While the invention herein is disclosed by means of specific embodiments and applications thereof, numerous modifications and variations could be made thereto without departing from the scope of the invention set forth in the claims.

First Embodiment

The first embodiment of the present invention explains an example in which the present invention is applied to an output type semiconductor device and manufacturing thereof comprised of an IGBT having a planar structure.
[Device Structure of a Semiconductor Device (IGBT)]

As is shown in FIG. 1, a semiconductor device (semiconductor chip) 10 related to the first embodiment is an IGBT and is arranged with a semiconductor substrate 50 which includes a first conductive first semiconductor region 1, arranged on one main surface 1A of the substrate 50, a plurality of second conductive second semiconductor regions 2 which are opposite to the first conductive type and are arranged at specific intervals on the one main surface 1A of the first semiconductor region 1, a plurality of first conductive third semiconductor regions 3 arranged separately on a main surface (the same main surface as the one main surface 1A) of the second semiconductor region 2, a gate electrode 12 arranged via a gate insulation film 11 on at least a second semiconductor region 2 across an interval between one third semiconductor region 3 of one second semiconductor region 2 and one different third semiconductor region 3 of one different second semiconductor region 2, a source electrode (or an emitter electrode) 14 electrically connected to a main surface (the same surface as the one main surface 1A) of adjacent third semiconductor regions 3 and a main surface of a second semiconductor region 2 and arranged between these third semiconductor regions 3 within one second semiconductor region 2, a plurality of holes 15 which are alternately arranged separately at specific intervals within the semiconductor substrate 50 on the another main surface (or the other main surface) 1B which faces the one main surface 1A of the semiconductor substrate 50, second conductive fourth semiconductor regions 4, an adjacent pair of which are alternately connected and arranged on a bottom part of the holes 15 within the semiconductor substrate 50, first conductive fifth semiconductor region 5 having a higher impurity density compared to the impurity density of a first semiconductor region 1 and arranged between a fourth semiconductor region 4 and a first semiconductor region 1, and a drain electrode (or collector electrode) 16 buried within the hole 15. A region which is sandwiched by the hole 15 and a fourth semiconductor region 4 becomes a first conductive first semiconductor region 1.

The first semiconductor region 1 in the first embodiment is comprised of n⁻ type silicon mono-crystalline. This first semiconductor region 1 is a semiconductor wafer in the prior process stage of the semiconductor manufacture process and a thin semiconductor wafer having a thickness of 50 μm-300 μm, for example, is used. The first semiconductor region 1 is used as an n type base region of the IGBT and is set with an impurity density of, for example, $10^{15}$ atoms/cm²-$10^{16}$ atoms/cm².

A plurality of the second semiconductor regions 2 are arranged separated at specific intervals in one main surface 1A of the semiconductor substrate 50. This second semiconductor region 2 is used as a p type base region of the IGBT and is set with an impurity density of, for example, $10^{17}$ atoms/cm²-$10^{16}$ atoms/cm².

A plurality of the third semiconductor regions 3 are arranged separated at specific intervals in a main surface of a second semiconductor region 2. This third semiconductor region 3 is used as an n type source region (or emitter region) of the IGBT and is set with an impurity density of, for example, $10^{19}$ atoms/cm²-$10^{20}$ atoms/cm².

The gate insulation film 11 is set on the one main surface 1A of the first semiconductor region 1 and a main surface of the second semiconductor region 2 from an end of a main surface of one third semiconductor region 3 within one second semiconductor region 2 across an adjacent end of a main surface of one different third semiconductor region 3 within one different second semiconductor region 3. It is possible to practically use a silicon oxide film, for example, for the gate insulation film 11.

The gate electrode 12 is a control electrode and is arranged on the gate insulation film 11. A poly-crystalline silicon film, for example, can be practically used as the gate electrode 12.

A passivation film 13 is arranged above the gate electrode 12. It is possible to use a PSG film, for example, for the passivation film 13.

The source electrode 14 is arranged above the passivation film 13 and the source electrode 14 is electrically connected to a main surface of the second semiconductor region 2 and a main surface of the third semiconductor region 3 which are exposed between the gate electrodes 12. It is possible to use an aluminum alloy, for example, as the source electrode 14.

The hole 15 is a trench or end hole which is dug down from the another main surface 1B of the first semiconductor region 1 towards the center part of the thickness direction of the first semiconductor region 1. This hole 15 is formed by anisotropic etching such as Reactive Ion Etching (RIE) and the hole depth is arranged larger (the aspect ratio is increased) compared to the hole width as will be explained below. The hole width of the hole 15 is set at, for example, 10 μm-50 μm and the hole depth is set at, for example, 50 μm-350 μm when the thickness of the semiconductor substrate is 100 μm-400 μm. Impurities are introduced to the hole 15 from the another main surface 1B of the first semiconductor 1 towards the bottom surface of the hole 15, and the introduction of these impurities functions as an impurity introduction path for forming the fourth semiconductor region 4 and the fifth semiconductor region 5 at the center part in the thickness direction of the first semiconductor region 1. Here, [introduction of impurities] is used in the meaning which includes impurity implantation using an ion implantation method and the diffusion of impurities using a solid phase diffusion method or heat diffusion method.

In addition, a drain electrode 16 is buried within the hole 15 and as is explained below this drain electrode 16 has a lower heat resistance, a lower electrical resistance and a higher mechanical strength compared to the heat resistance, electrical resistance, and mechanical strength of the first semiconductor region 1. Therefore, because the heat which is generated in the switching operation of the IGBT can be discharged via the drain electrode 16 which has a small heat resistance buried within the hole 15 from the center part in a thickness direction of the first semiconductor 1, it is possible to improve the heat discharge effects from the another main surface 1B of the first semiconductor 1. In addition, because the drain current of the IGBT can flow via the drain electrode 16 which has a small heat resistance buried within the hole 15, it is possible to reduce the ON resistance of the IGBT. Furthermore, because it is possible to reinforce the mechanical strength of the first semiconductor region 1, that is, the substrate (semiconductor wafer) by the drain electrode 16 which has a high mechanical strength and is buried within the hole 15, it is possible to increase the rigidity of the substrate itself.

The fourth semiconductor region 4 is structured via the hole 15 by activating the p type impurities which were introduced to the bottom surface of the hole 15. The fourth semiconductor region 4 is electrically connected to another adjacent fourth semiconductor region 4 (as is shown in FIG. 1, adjacent fourth semiconductor regions 4 are alternately linked by activation and are structured as one unit). In other words, a plurality of the holes 15 are arranged at appropriate intervals in an interval in which adjacent fourth semiconductor regions 4 are alternately connected. In addition, between the first semiconductor region 1 and the drain electrode 16 which is buried within the hole 15, because it sufficient that fourth semiconductor regions 4 become one unit by activation, the hole 15 may be formed as a hole with a stripe shape as seen from the another main surface 1B, or a hole formed with a dot shape. The thickness at the bottom surface of the hole 15 of the fourth semiconductor region 4 is constructed thicker than the thickness between the holes 15 of the fourth semiconductor regions 4. This is based on the impurities introduced within the first semiconductor region 1 being effectively and isotropically diffused at the bottom surface of the hole 15. The fourth semiconductor region 4 is arranged with an impurity density of, for example, $10^{18}$ atoms/cm$^2$-$10^{19}$ atoms/cm$^2$ which is higher than the impurity density of the second semiconductor region 2 which functions as a base region.

The fifth semiconductor region 5 is structured the same as the fourth semiconductor region 4 via the hole 15 by activating the n type impurities which were introduced to the bottom surface of the hole 15. The fifth semiconductor region 5, for example, controls the amount of energy at the time of introducing impurities, and the peak of the impurities is set between the first semiconductor region 1 and the fourth semiconductor region 4. The same as the fourth semiconductor region 4, the fifth semiconductor region 5 is electrically connected to another adjacent fifth semiconductor region 5 (as is shown in FIG. 1, adjacent fourth semiconductor regions 5 are alternately linked by activation and are structured as one unit).

The thickness at the bottom surface of the hole 15 of the fifth semiconductor region 5 is constructed thicker than the thickness between the holes 15 of the fifth semiconductor regions 5. The fifth semiconductor region 5 is arranged with an impurity density of, for example, $10^{18}$ atoms/cm$^2$-$10^{19}$ atoms/cm$^2$ which is higher than the impurity density of the first semiconductor region 1 which functions as a base region and lower than the impurity density of the third semiconductor region 3 which functions as a source region. The fifth semiconductor region 5 functions as an n type drain region (or a collector region). The interval between this fifth semiconductor region 5 and the semiconductor region 4 forms a pn junction of a pair of semiconductor regions which have a high level of impurity density, controls the extension of the depletion layer which widens from the pn junction and a punch-through type IGBT is constructed.

The drain electrode 16 is arranged on the another main surface 1B of the first semiconductor region 1 when the inside of the hole 15 is laid as stated above. As stated above, the drain electrode 16 is constructed from a conductive material which has a small heat resistance, small electrical resistance and high mechanical strength. It is possible to practically use, for example, a single layer film of nickel (Ni) for the drain electrode 16. In addition, it is possible to practically use stacked layers of titanium (Ti), Ni and Au each stacked in order from the semiconductor region 50 side as the drain electrode 16.

[Manufacturing Method of the Semiconductor Device]

The manufacturing method of the semiconductor device 10 related to the first embodiment stated above will be explained using FIG. 2 to FIG. 5.

Figure 2:
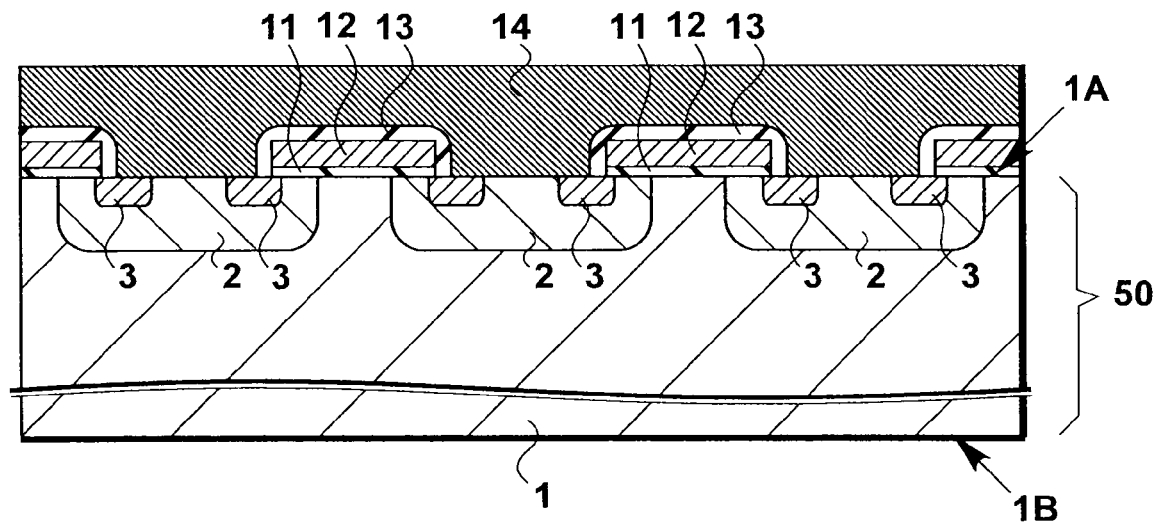
FIG. 2 is cross sectional diagram of a first process which explains the manufacturing process of a semiconductor device related to the first embodiment.

Firstly, the first conductive, that is, n type first semiconductor region 1, is prepared (refer to FIG. 2). The first semiconductor region 1, at this point, is at a prior process stage of the semiconductor manufacturing process in the form of a semiconductor wafer.

Next, a second conductive, that is, p type second semiconductor region 2 is formed on one main surface 1A of the first semiconductor region 1, and a first conductive third semiconductor region 3 is formed on a main surface of the second semiconductor region 2 (refer FIG. 2). The second semiconductor region 2 and the third semiconductor region 3 are each formed by, for example, introducing impurities by using an ion implantaion method, thermal diffusion method and solid phase diffusion method and activating these impurities.

Next, the gate insulation film 11, gate electrode 12 and passivation film 13 are each formed in this order (refer to FIG. 2). As is shown in FIG. 2, the source electrode 14 which is connected to the second semiconductor region 2 and the third semiconductor region 3 is formed on the passivation film 13.

Next, the one main surface 1A side of the first semiconductor region 1 is protected by a photo resist for example not shown in the diagram. Then, on the another main surface 1B side of the first semiconductor region 1, a back-grind process is performed, the another main surface 1B of the semiconductor region 1 is shaved to an appropriate thickness and the first semiconductor region 1 is thinned (refer to FIG. 3).

Figure 3:
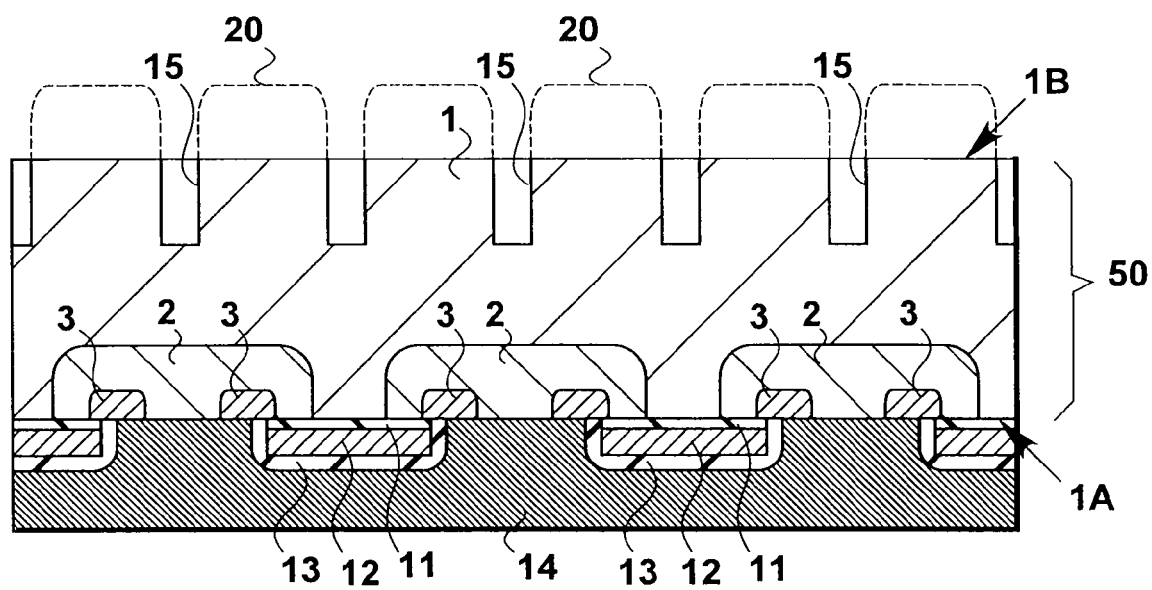
FIG. 3 is a cross sectional diagram of a second process.

As is shown in FIG. 3, the hole 15 is dug from the another main surface 1B of the first semiconductor region 1 to the center part of the thickness direction of the first semiconductor region 1. The hole 15 is formed using a mask formed using photolithography technology indicated by the broken line 20 in FIG. 3, and by partially removing the first semiconductor region 1 using anisotropic etching such as RIE.

Figure 4:
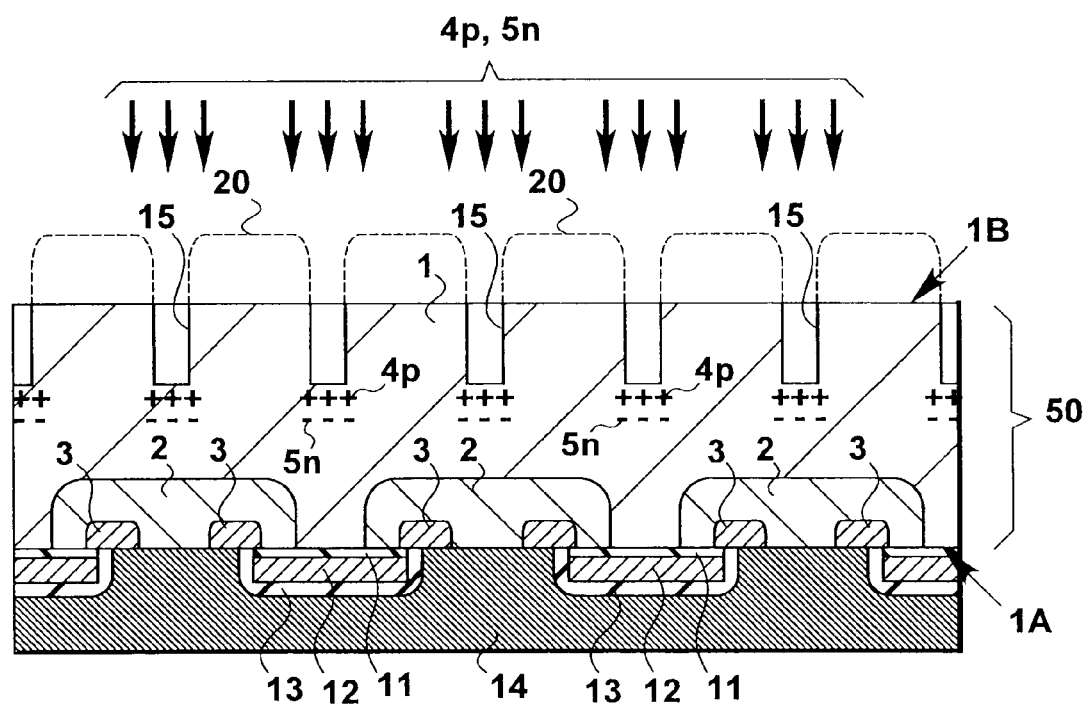
FIG. 4 is a cross sectional diagram of a third process.

As is shown in FIG. 4, the mask 20 stated above is used as it is as a resistive impurity introduction mask and in the bottom surface of the hole 15 stated above, first conductive impurities 5n and second conductive impurities 4p are each introduced to the center part of the thickness direction of the first semiconductor region 1. The order of the introduction of these impurities is not particularly limited. In the first embodiment, an ion implantation method is used to introduce each of these impurities 5n, 4p. The amount of energy is controlled at the time of ion implantation so that the impurities 4p has an impurity density peak at the side near the bottom surface of the hole 15, and so that the impurities 4p has an impurity density peak at the side furthest from the bottom surface of the hole 15. Following this, the mask 20 is removed.

Figure 5:
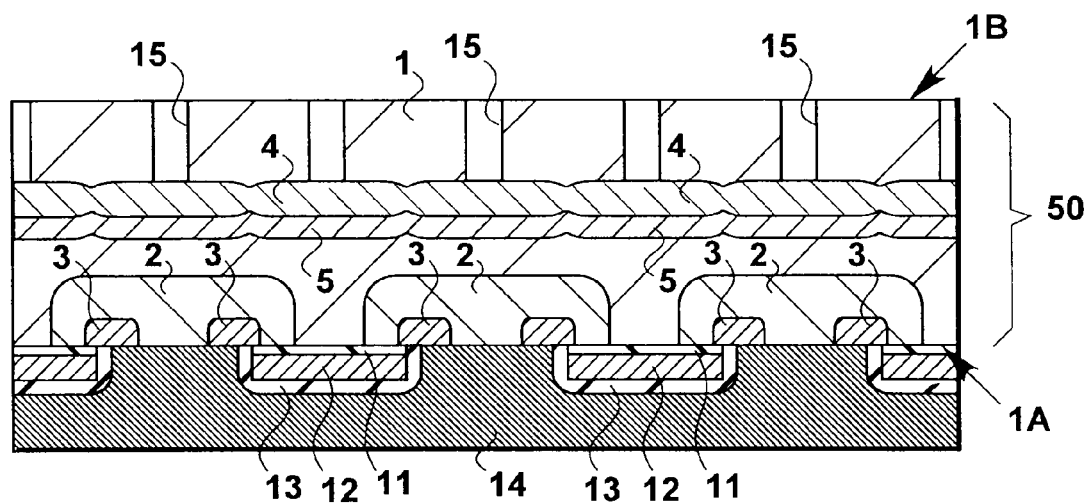
FIG. 5 is a cross sectional diagram of a fourth process.

As is shown in FIG. 5, an annealing treatment is performed, the second conductive fourth semiconductor region 4 is formed by activating the impurities 4p, and the first conductive fifth semiconductor region 5 is formed by activating the impurities 5n.

Because the impurities 4p and the impurities 5n are diffused in a thickness direction (vertical direction) and a main surface direction (horizontal direction) of the first semiconductor region 1 when they are activated, at each of the bottom surfaces of adjacent holes 15, a pair of fourth semiconductor regions 4 are alternately connected and a pair of fifth semiconductor regions 5 are alternately connected.

Next, a drain electrode 16 is formed on the another main surface 1B of the first semiconductor region 1 (refer to FIG. 1 stated above). This drain electrode 16 is buried within the hole 15 and is electrically connected to the fourth semiconductor region 4 which is exposed at the bottom surface of the hole 15. The drain electrode 16 is formed by an Ni film formed by a sputtering method for example, and in order to plane the surface of the drain electrode 16 or to obtain an appropriate thickness of the drain electrode 16, a chemical mechanical polishing (CMP) process, for example, is performed on the drain electrode 16 after film formation.

When this series of manufacturing processes are completed, the semiconductor device 10 related to the first embodiment is complete.

[Characteristics of the Semiconductor Device]

As was explained above, in the semiconductor device 10 related to the first embodiment, because the hole 15 is formed on the another main surface 1B side of the first semiconductor region 1 at the bottom surface of this hole 15 and the fourth semiconductor region 4 is formed at the center part of the thickness direction of the first semiconductor region 1, it is possible to reduce the amount of back-grind processing of the another main surface 1B of the first semiconductor region 1 and shorten the manufacturing time of the semiconductor manufacturing process. Further, in the semiconductor device 10 related to the first embodiment, because it is possible to form the fourth semiconductor region 4 and the fifth semiconductor region 5 by introducing impurities 4p and 5n via the hole 15 to the center part of the thickness direction of the first semiconductor region 1, it is no longer necessary to use an expensive semiconductor wafer on which an epitaxial growth layer is formed and it is possible to reduce the manufacturing costs of the semiconductor manufacturing process.

In addition, in the semiconductor device 10 related to the first embodiment, because impurities 4p and 5n are introduced via the hole 15 and the fourth semiconductor region 4 and fifth semiconductor region 5 are formed, as well as being able to reduce ON resistance as an IGBT which uses a thinned wafer, it is also possible to form the thickness of the first semiconductor region 1 of the part which does form the hole 15 relatively thin. Therefore, because it is possible to increase the mechanical strength of semiconductor device 10 which has excellent electrical characteristics, in the delivery process during the semiconductor manufacturing process or in the delivery process after commercialization of the product, it is possible to easily handle the product and prevent damage that comes with handling and also reduce manufacturing time and delivery time.

In addition, in the semiconductor device 10 related to the first embodiment, because the drain electrode 16 with a small heat resistance is buried within the hole 15 which is arranged on the another main surface 1B of the first semiconductor 1, it is possible to improve heat discharge effects.

Furthermore, in the semiconductor device 10 related to the first embodiment, because the drain electrode 16 with a small electrical resistance is buried within the hole 15 which is arranged on the another main surface 1B of the first semiconductor 1, it is possible to reduce ON resistance.

In addition, in the semiconductor device 10 related to the first embodiment, because the drain electrode 16 with a high mechanical strength is buried within the hole 15 which is arranged on the another main surface 1B of the first semiconductor 1, it is possible to improve the mechanical strength of the first semiconductor region 1 (substrate) itself.

Second Embodiment

The second embodiment of the present invention explains an example in which a cross sectional structure of the fourth semiconductor region 4 arranged at the center part of the thickness direction of the first semiconductor region 1 at the bottom surface of the hole 15 in the semiconductor device 10 related to the first embodiment stated above is changed.

[Structure of the Semiconductor Device]

Figure 6:
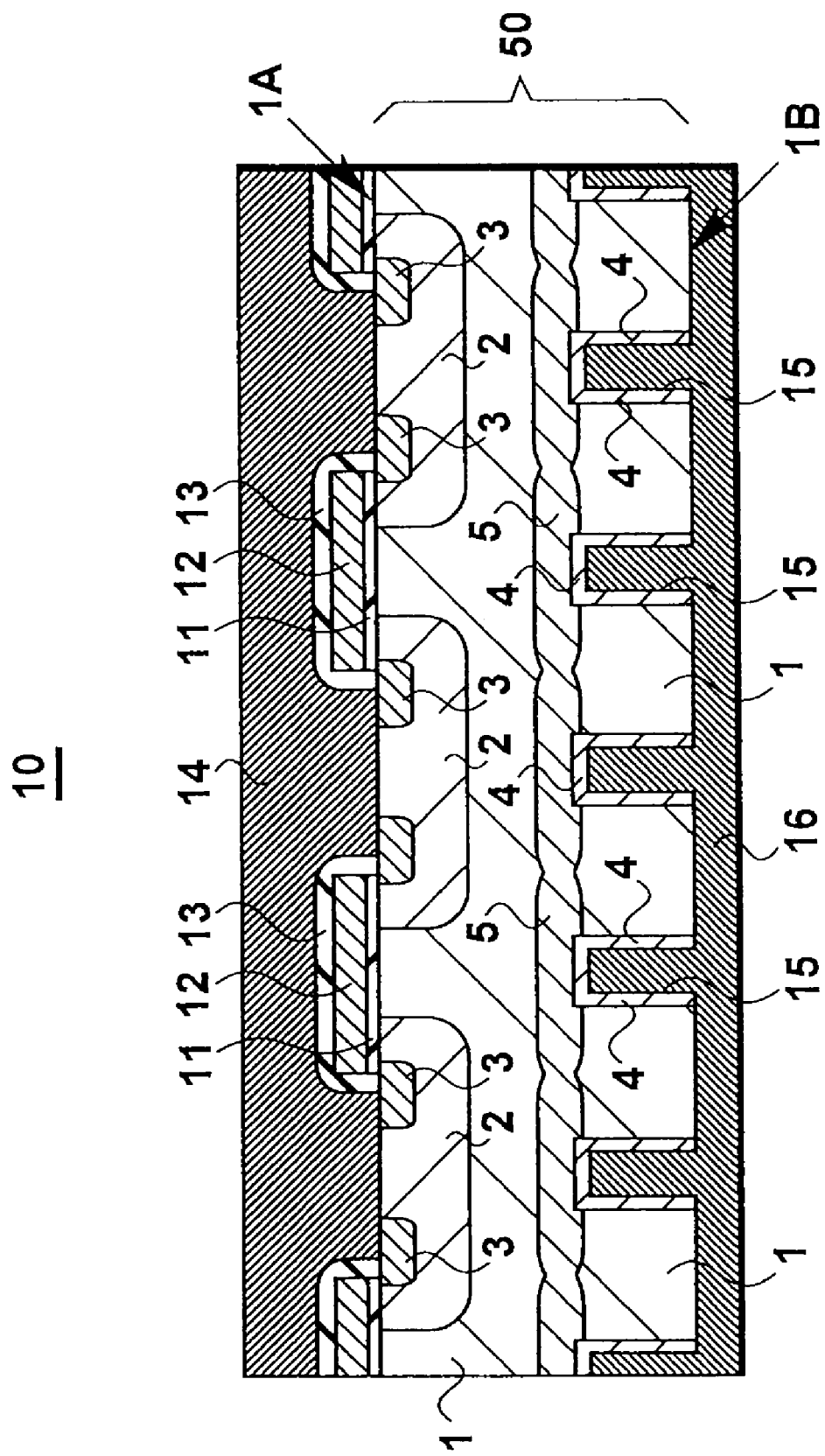
FIG. 6 is a cross sectional diagram of a semiconductor device related to a second embodiment of the present invention.

As is shown in FIG. 6, although the semiconductor device 10 related to the second embodiment is basically the same as the semiconductor 10 in which an IGBT is formed having a planar structure related to the first embodiment stated above, a second conductive fourth semiconductor region 4 is arranged along the bottom surface and side wall of the hole 15 of the first semiconductor region 1. The thickness of the fourth semiconductor region 4 is almost equal in both the bottom surface and side wall of the hole 15. Here, the hole 15 may be have a stripe shape or a dot shape, the same the hole 15 of the semiconductor device 10 related to the first embodiment stated above.

[Manufacturing Method of the Semiconductor Device]

Figure 7:
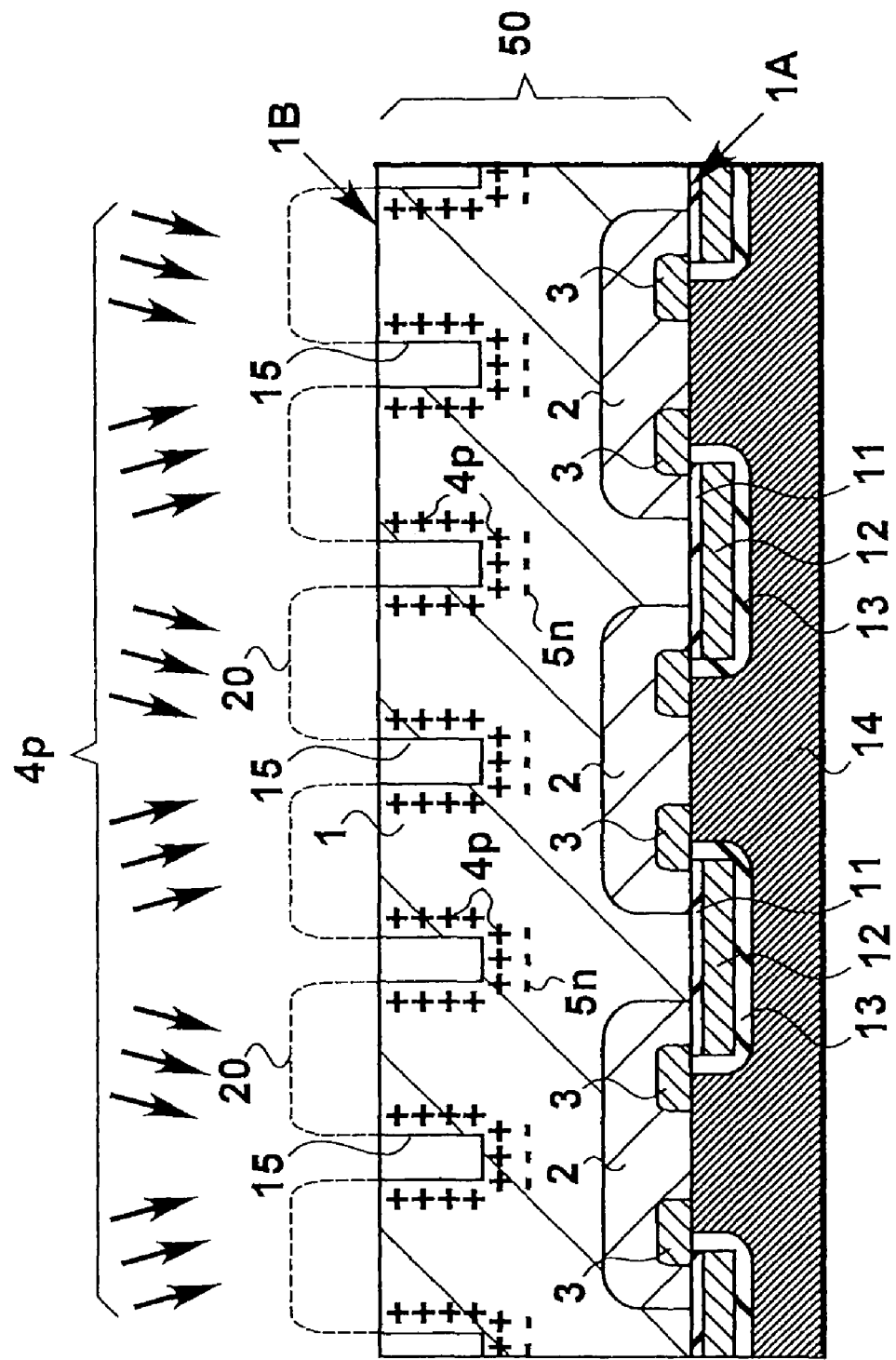
FIG. 7 is cross sectional diagram of a process which explains the manufacturing process of a semiconductor device related to the second embodiment.

Although the manufacturing method of the semiconductor device 10 related to the second embodiment is basically the same as the manufacturing method of the semiconductor device 10 related to the first embodiment, after forming the hole 15 shown in FIG. 3 stated above, the second conductive impurities 4p are introduced within the first semiconductor region 1 in the bottom surface and side wall of the hole 15 as is shown in FIG. 7. In the second embodiment, an oblique ion implantation method, for example, is used for introducing the impurities 4p.

As was explained above, in the semiconductor device 10 related to the second embodiment, it is possible to demonstrate the same operational effects as those obtained by the semiconductor device 10 related to the first embodiment stated above.

Third Embodiment

The third embodiment of the present invention explains an example in which the semiconductor device 10 related to the first embodiment stated above is replaced with a semiconductor device comprised from an IGBT having a trench gate structure.

[Structure of the Semiconductor Device]

Figure 8:
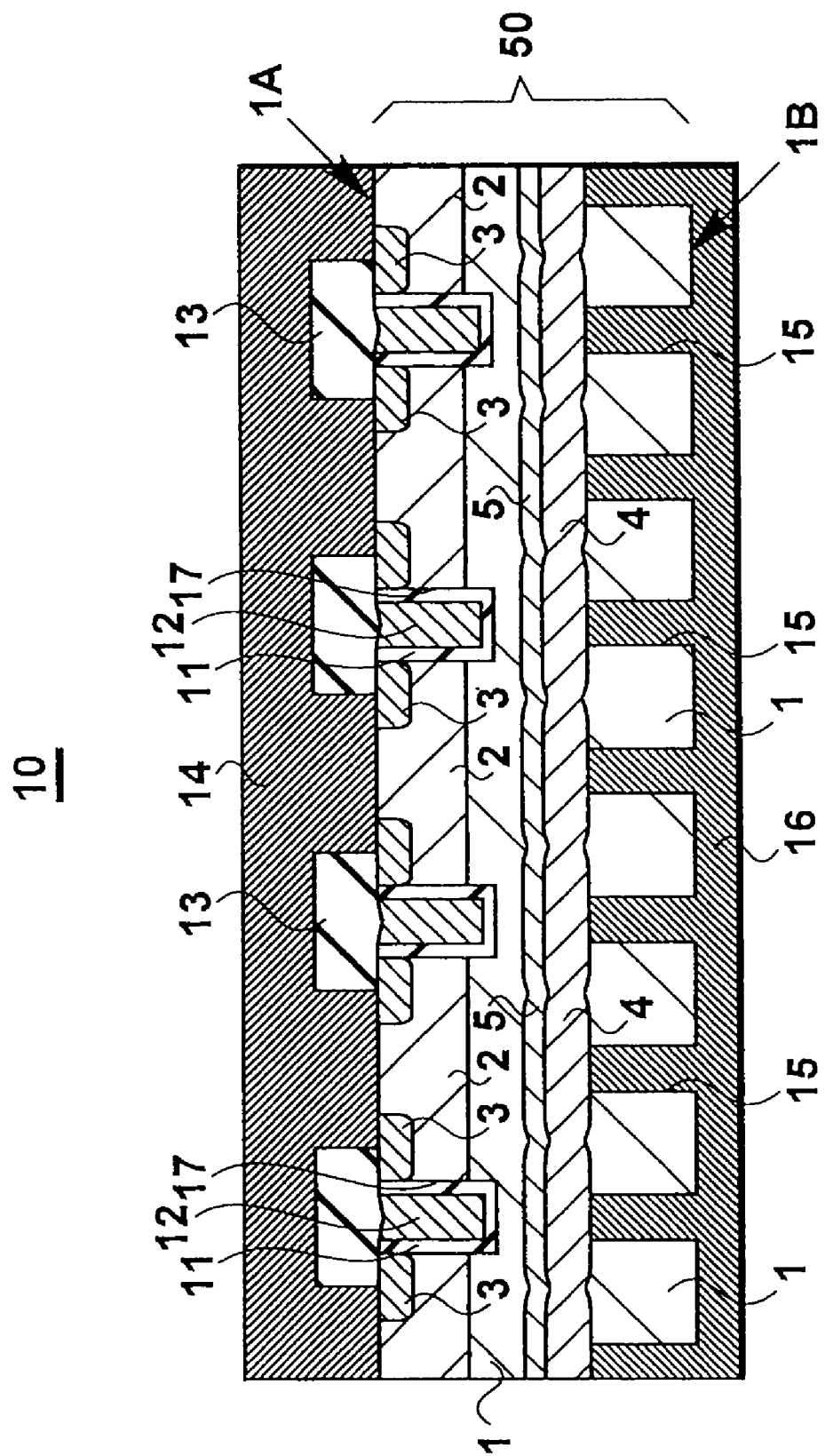
FIG. 8 is a cross sectional diagram of a semiconductor device related to a third embodiment of the present invention.

As is shown in FIG. 8, the semiconductor device 10 related to the third embodiment is an IGBT which has a trench gate structure. That is, in the semiconductor device 10, a trench 17 is further arranged between adjacent second semiconductor regions 2 on one main surface 1A of the semiconductor substrate 50, a gate insulation film 11 is arranged along the bottom surface and side wall of the trench 17 and a gate electrode 12 buried within the trench 17 is arranged above this insulation film 11.

As was explained above, in the semiconductor device 10 related to the third embodiment, it is possible to demonstrate the same operational effects as those obtained by the semiconductor device 10 related to the first embodiment stated above.

Fourth Embodiment

The fourth embodiment of the present invention explains an example in which the semiconductor device 10 related to the second embodiment stated above is replaced with a semiconductor device comprised from an IGBT having the trench gate structure.

[Structure of the Semiconductor Device]

Figure 9:
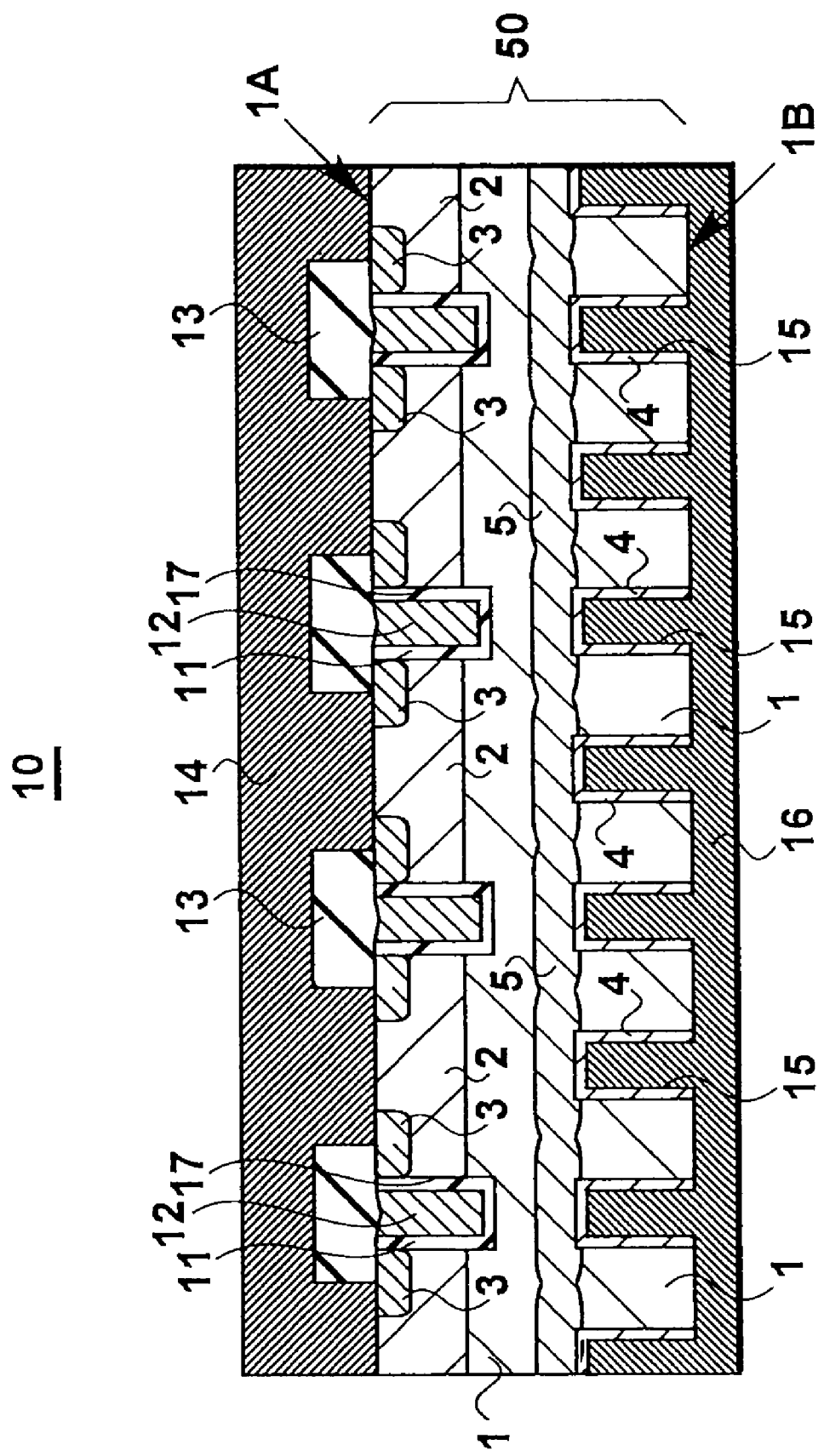
FIG. 9 is a cross sectional diagram of a semiconductor device related to a fourth embodiment of the present invention.

As is shown in FIG. 9, the semiconductor device 10 related to the fourth embodiment is an IGBT which has a trench gate structure. That is, the semiconductor device 10 related to the fourth embodiment is a combination of the semiconductor device 10 related to the second embodiment stated above and the semiconductor device 10 related to the third embodiment stated above.

As was explained above, in the semiconductor device 10 related to the fourth embodiment, it is possible to demonstrate the same operational effects as those obtained by the semiconductor device 10 related to the first embodiment stated above.

Other Embodiments

As stated above, the present invention was described by the first to fourth embodiments, however, the explanations and drawings which describe a part of this disclosure are not limited to this invention. The present invention can be applied to various alternative embodiments, examples and technologies.

For example, because the saturation voltage of the IGBT has a positive temperature coefficient, in the present invention, the hole 15 of the semiconductor device 10 related to the first to fourth embodiments stated above is formed in the center region in which the IGBT of the semiconductor substrate 50 is arranged and the hole 15 does not have to be formed in the periphery region in which the IGBT of the semiconductor device 10 is not arranged. In addition, in the present invention, the number of holes 15 may be less per fixed area arranged in the periphery region of the semiconductor substrate 50 compared to the number of holes 15 per the same fixed area which are arranged in the center region of the semiconductor substrate 50.

Further, in the embodiments stated above, the semiconductor device 10 comprised of an IGBT was explained, however, the present invention is not limited to an IGBT and can be applied to a semiconductor device comprised from a vertical type power transistor. For example, a fourth semiconductor region 4 is not arranged in the center region of the semiconductor substrate 50 in which the temperature can easily become high and the present invention may be made to function as a MOSFET (Metal Oxide Semiconductor Field Effect Transistor) and the IGBT related to the embodiment stated above may be formed having a positive temperature coefficient in the saturation voltage in the periphery region of the semiconductor substrate 50 which does not become very hot.

That is, the present invention can be widely applied to a semiconductor device which adopts a thinned semiconductor wafer.

According to the present invention, it is possible to improve heat discharge effects and mechanical strength of a substrate and provide a semiconductor device and manufacturing method thereof which is simple and can reduce manufacturing costs.

What is claimed is:

1. A method of manufacturing a semiconductor device, the method comprising:
    forming a plurality of second conductive second semiconductor regions at specific intervals on one main surface of a first conductive first semiconductor region, the plurality of second conductive second semiconductor regions being opposite to the first conductive of the first semiconductor region;
    forming a plurality of first conductive third semiconductor regions on a main surface of the second semiconductor regions, the plurality of the first conductive third semiconductor regions being separated from each other;
    forming a control electrode on the one main surface side;
    forming a plurality of holes at specific intervals on an another main surface which faces the one main surface of the first semiconductor region, the plurality of holes being separated from each other;
    forming second conductive fourth semiconductor regions mutually connected at bottom parts of the holes; and
    filling the holes with an electrode to establish an electric connection between the electrode and the fourth semiconductor regions.

2. The method of manufacturing a semiconductor device according to claim 1, wherein the fourth semiconductor region is formed at a bottom part and along a side wall of the hole within the first semiconductor region.

3. The method of manufacturing a semiconductor device according to claim 1, further comprising:
    introducing second conductive impurities to the bottom parts of the holes and diffusing the impurities into the first semiconductor region in a lateral direction relative to the holes to form the second conductive fourth semiconductor regions which are mutually connected.

4. The method of manufacturing a semiconductor device according to claim 2, wherein the second conductive impurities are introduced to a bottom part of the hole within the first semiconductor region and a pair of the fourth semiconductor regions which are alternately connected are formed by diffusing the impurities in a width direction of the hole.

5. The method of manufacturing a semiconductor device according to claim 1, wherein a conductive material having a higher mechanical strength compared to a mechanical strength of the first semiconductor region is filled within the hole.

6. The method of manufacturing a semiconductor device according to claim 2, wherein a conductive material having a higher mechanical strength compared to a mechanical strength of the first semiconductor region is filled within the hole.

* * * * *